US007024007B1

(12) United States Patent
Charbonnaux et al.

(10) Patent No.: US 7,024,007 B1
(45) Date of Patent: Apr. 4, 2006

(54) ELECTRIC SIGNAL PROCESSING OF ELECTROACOUSTIC TRANSDUCER

(75) Inventors: Marc Charbonnaux, Lyons (FR); Patrice Morchain, L'Isle d'Abeau (FR); Pierre Piccaluga, L'Isle d'Abeau (FR); Claude-Annie Perrichon, L'Isle d'Abeau (FR)

(73) Assignee: Atao, Le Grand Duche Luxembourg (LU)

( * ) Notice: Subject to any disclaimer, the term of this patent is extended or adjusted under 35 U.S.C. 154(b) by 0 days.

(21) Appl. No.: 10/031,613

(22) PCT Filed: Jul. 22, 1999

(86) PCT No.: PCT/FR99/01808

§ 371 (c)(1),
(2), (4) Date: May 20, 2002

(87) PCT Pub. No.: WO01/08446

PCT Pub. Date: Feb. 1, 2001

(51) Int. Cl.
*H03G 5/00* (2006.01)
*H03G 3/00* (2006.01)
*H04R 3/00* (2006.01)
*G10H 1/00* (2006.01)

(52) U.S. Cl. .......................... 381/98; 381/111; 381/61; 381/62; 381/118

(58) Field of Classification Search ............ 381/98–99, 381/58, 59, 111, 116–117, 61, 97, 103
See application file for complete search history.

(56) References Cited

U.S. PATENT DOCUMENTS

| | | | | | |
|---|---|---|---|---|---|
| 4,052,571 | A | * | 10/1977 | Gregory et al. | 381/321 |
| 4,243,840 | A | * | 1/1981 | Kates | 381/99 |
| 4,354,415 | A | * | 10/1982 | Sonnabend | 84/706 |
| 4,428,270 | A | * | 1/1984 | Ippolito | 84/706 |
| 4,602,337 | A | * | 7/1986 | Cox | 381/93 |
| 5,388,159 | A | * | 2/1995 | Sakata | 381/61 |

FOREIGN PATENT DOCUMENTS

| | | | |
|---|---|---|---|
| EP | 0 598 197 | A2 | 5/1994 |
| EP | 0 598 197 | A3 | 5/1994 |
| NL | 8 402 074 | A | 1/1986 |
| WO | 89 02188 | A | 3/1989 |

OTHER PUBLICATIONS

Patent Abstract of Japan, vol. 17, No. 620 (E-1460) Nov. 16, 1993.

* cited by examiner

*Primary Examiner*—Laura A. Grier
(74) *Attorney, Agent, or Firm*—Birch, Stewart, Kolasch & Birch, LLP

(57) ABSTRACT

It is usual to utilize electric current filters for electroacoustic transducers, the filters are in general frequency mixers. Audio electric signals have a pulse response quality and excellent frequency adjustment. As for electroacoustic transducers, the transformation is not properly carried out for electroacoustic transducers. The electric pulses travel at the speed of the electrons whereas the membrane and its motor have a specific weight. The weight has a mechanical inertia preventing an instantaneous response to the electric effects. A method can modify at least one modulation of the original electric pulse into micro electrical phase shifts. The micro phase shifts are generated by impedance of the components. An apparatus has several components of similar type mounted in parallel, thereby forming a self-powered oscillator, energized by the original electric signal. The apparatus is mounted on the circuit powering the enclosure.

10 Claims, 1 Drawing Sheet

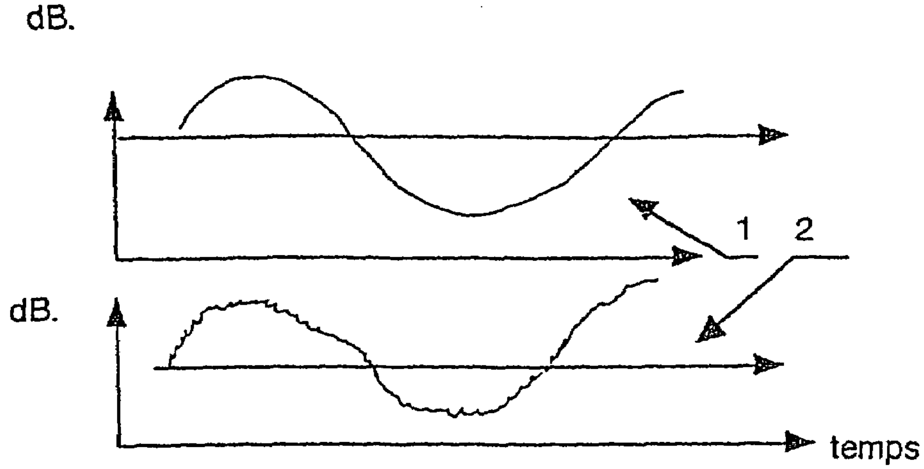
Fig. 1
Fig. 2
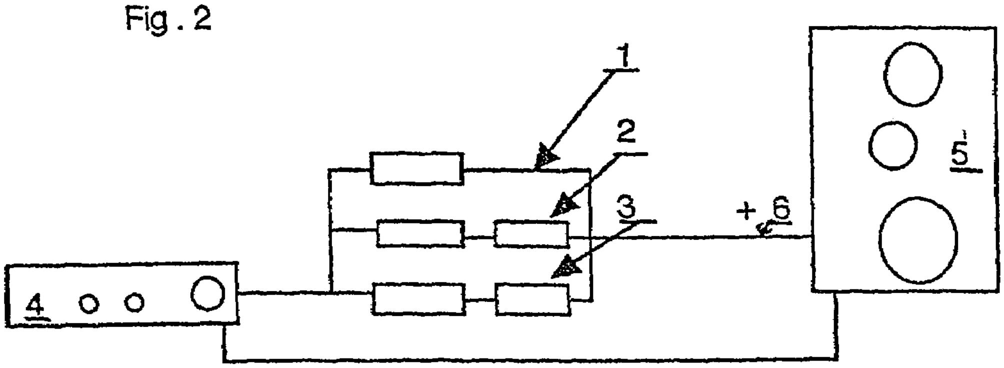
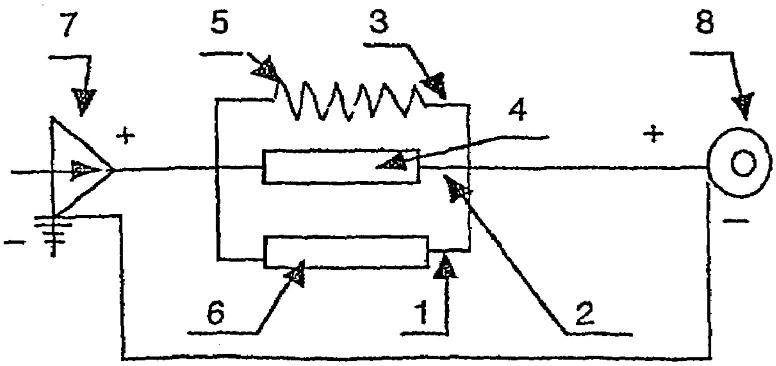
Fig. 3

ELECTRIC SIGNAL PROCESSING OF ELECTROACOUSTIC TRANSDUCER

CROSS-REFERENCE TO RELATED APPLICATION

This application is the national phase under 35 U.S.C. § 371 of PCT International Application No. PCT/FR99/01808 which has an International filing date of Jul. 22, 1999, which designated United States of America.

BACKGROUND OF THE INVENTION

It is common to use electric current filters for electro-acoustic transducers. These filters are usually frequency attenuators the equalizing slope of which is 6 dB, 12 dB, 18 dB. Mixers use these more or less sophisticated filters in order to modify the audio bandwave frequencies. On the other hand, it is common to have curves of the electric signal as perfect as possible, i.e. to obtain square wave responses as perfect as possible.

It is found in the current technology used that the audio electric signals have excellent pulse response and frequency control quality. With regard to electro-acoustic transducers, the transformation of the electric signal is incorrectly executed by the transducer(s).

In fact, the electric pulses are sent at the speed of the electrons whereas the diaphragm and its motor make up an electromechanical assembly of a given weight. The weight of this mobile assembly has mechanical inertia preventing an instant response to the electric stresses of the audio signal, thereby creating distortions, even absences of sound as the diaphragm cannot respond simultaneously to all the electrical values.

BRIEF DESCRIPTION OF THE DRAWINGS

FIG. 1 shows an original electric signal and a modulated electric signal by a process in accordance with an embodiment of the present invention;

FIG. 2 shows a schematic view of an apparatus for modulating an original electric signal in accordance with an embodiment of the present invention; and FIG. 3 shows a schematic view of an apparatus for modulating an original electric signal in accordance with an embodiment of the present invention.

DETAILED DESCRIPTION OF THE EMBODIMENTS

This process enables the original electric pulse to be modified into at least one modulation, pulses, micro electric phase shifts shifting the instant electric pulse into delayed electric micro-pulses. Thus, the starting driving force of the movement on the diaphragm is distributed into a very short time interval so as not to saturate the coil with current, with the motor of the mechanical assembly in movement which can thus absorb, once the acceleration factor is acquired, the rest of the pulse of the original current. These micro-currents are generated by the impedances which crossed by the original electric signal, generate electric oscillations by their counter-electro-driving forces.

The components are parallel mounted over at least two levels.

The components, mounted on three parallel levels respond better to electric phase shifting for the electric absorption of the transducers.

The process is therefore the positioning of a self-supplied oscillator, activated by the original audio signal crossing the components making it up to obtain an oscillated signal of a very low amplitude, of oscillations of very big frequencies. (FIG. 1). This new signal (2) keeps the general aspect of the original signal (1) which is continuously modulated. This parallel mounting process of components of the same type but of different values thus enables a modification of the audio, digital, electro-acoustic transducer supply signal, of at least one acoustic transducer or one acoustic speaker. In fact, this process is placed between an amplifier and an acoustic speaker or a transducer, on the supply line.

This process creates micro interference on the original electric signal which does not change the general curve of the signal at all but which gives an apparently parasitic aspect of the original signal. The components of this process can be electric passive or active components, micro processors, integrated circuits or future technology.

This process is represented by the (FIG. 1) of which the curve 1 of the electric audio signal is modified into curve 2 according to this process which modifies the perfectly smooth signal into at least one rippled signal.

This process has also a unit made up (FIG. 2) of several electric components, in this case wound resistors, parallel mounted. The first channel (1) is made up of at least one component, the second parallel channel (2) is made up of at least one component, in this case, two serial-mounted components. The third channel (3) is also made by at least one electric component, in this case two serial-mounted components. The assembly thus made up is an interface module, energised by the original electric signal, mounted between the amplifier (4) and the acoustic speaker (5). The supply wire (6) of the + taking the interface module of this process. This non-limiting example is made by a person skilled in the art. This unit made up of components of the same type with different values, is mounted on any electric power supply of an acoustic speaker or of at least one electro-acoustic transducer.

This process (FIG. 3) is an alternative of the process made up on channel (1) of at least one electric component, on channel (2) of at least one electric component, being in this case two different wound resistors (4,6), respectively 3.3 Ohms and 8.2 Ohms. The channel (3) is made up of a self-inductance coil (5) of 18 turns. All the components in parallel are mounted on the supply of at least one electro-acoustic transducer (8) of a television, linked to its audio generator (7). The set of values of the components is such that the original, analog or digital audio signal is not altered in its whole by an attenuation of frequency but is subject to micro-oscillations resembling a slight steady interference due to the electric phase shift caused by the components which intervene directly due to their type on the supply current of the electric signal.

This module is an interface unit between an analog or digital audio signal and an electro-acoustic transducer so that it can absorb the electric pulses to be transformed into a mechanical movement more easily (FIG. 3).

It is to be pointed out that the module must never make up an attenuation frequency filter of 6 dB or more.

This process and unit are aimed at improving the comfort conditions of electro-acoustic reproduction and the quality of acoustic reproduction which can be used in the sound, audio and audiovisual reproduction field.

What is claimed is:

1. Process in the sound reproduction field comprising an step of placing an oscillator between an electric audio signal supply and at least one electro-acoustic transducer, said oscillator comprising at least one electric component per channel on three channels in parallel to modify an original electric signal into at least one very low amplitude and high frequency oscillating electric signal while not modifying the general aspect of the original electric signal, said oscillator being self-supplied by the original electric signal which upon passing through the oscillator, modifies an original electric pulse into at least one electric micro-phase-shift modulated pulse.

2. Apparatus for the reproduction of sound, comprising an oscillator with at least one electric component per channel on three channels in parallel, said oscillator being mounted between an electric power supply and at least one electro-acoustic transducer, said oscillator creating at least one electric micro-phase shift modulation of an original electric pulse in order to modify an original electric signal into at least one very low amplitude and high frequency oscillating electric signal while not modifying the general aspect of the original signal.

3. The apparatus according to claim 2, wherein said electric components comprise active components.

4. The apparatus according to claim 2, wherein said electric components comprise microprocessors.

5. The apparatus according to claim 2, wherein said electric components are of a same type on at least two parallel channels.

6. The apparatus according to claim 5, wherein said electric components have different values.

7. The apparatus according to claim 6, wherein said electric components comprise active components.

8. The apparatus according to claim 6, wherein said electric components comprise microprocessors.

9. The apparatus according to claim 6, wherein said electric components comprise passive components.

10. The apparatus according to claim 2, wherein said electric components comprise passive components.

* * * * *